(12) United States Patent
Abe et al.

(10) Patent No.: US 10,418,543 B2
(45) Date of Patent: Sep. 17, 2019

(54) METHOD OF MANUFACTURING AN OXIDE SINGLE CRYSTAL SUBSTRATE FOR A SURFACE ACOUSTIC WAVE DEVICE

(71) Applicant: SHIN-ETSU CHEMICAL CO., LTD., Tokyo (JP)

(72) Inventors: Jun Abe, Annaka (JP); Masayuki Tanno, Annaka (JP); Yoshinori Kuwabara, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 15/542,703

(22) PCT Filed: Jan. 6, 2016

(86) PCT No.: PCT/JP2016/050213
§ 371 (c)(1),
(2) Date: Jul. 11, 2017

(87) PCT Pub. No.: WO2016/121429
PCT Pub. Date: Aug. 4, 2016

(65) Prior Publication Data
US 2017/0373245 A1    Dec. 28, 2017

(30) Foreign Application Priority Data

Jan. 26, 2015 (JP) .................... 2015-012070

(51) Int. Cl.
*H01L 41/39* (2013.01)
*C30B 31/02* (2006.01)
(Continued)

(52) U.S. Cl.
CPC .............. *H01L 41/39* (2013.01); *C30B 29/30* (2013.01); *C30B 31/02* (2013.01); *H01L 41/18* (2013.01);
(Continued)

(58) Field of Classification Search
CPC ......... C30B 29/30; C30B 31/02; H01L 41/18; H01L 41/39; H03H 9/02559
See application file for complete search history.

(56) References Cited

U.S. PATENT DOCUMENTS

| 5,520,903 A | * | 5/1996 | Chang | .................... | C01G 31/00 |
| | | | | | 423/594.15 |
| 2013/0115097 A1 | * | 5/2013 | Berger | .................... | B32B 15/01 |
| | | | | | 416/241 R |

FOREIGN PATENT DOCUMENTS

| EP | 893515 A1 | * | 1/1999 |
| JP | 2013066032 A | * | 4/2013 |

OTHER PUBLICATIONS

Callister; Materials Science and Engineering: an Introduction 5th ed, ©2000 John Wiley & Sons, Inc, p. 96-100 (Year: 2000).*

(Continued)

*Primary Examiner* — Nathan H Empie
(74) *Attorney, Agent, or Firm* — Westerman, Hattori, Daniels & Adrian, LLP

(57) ABSTRACT

[Object]
An object of the present invention is to provide a method for manufacturing an oxide single crystal substrate having less dispersion in characteristics within the substrate surface.
[Means to solve the Problems]
In the manufacture method of the present invention, a powder containing a Li compound is dispersed in a medium to form a slurry, and heat is applied while the slurry is in contact with the surface of the oxide single crystal substrate, so as to diffuse Li into the substrate from the surface thereof to effect a modification of the substrate; or after the slurry is brought into contact with the surface of the oxide single crystal substrate, the oxide single crystal substrate is buried in a powder containing the Li compound, and heat is applied
(Continued)

to effect the diffusion of Li in the substrate from the surface thereof whereby a modification of the substrate occurs.

8 Claims, 4 Drawing Sheets

(51) Int. Cl.
    *H03H 3/08*     (2006.01)
    *H03H 9/25*     (2006.01)
    *C30B 29/30*     (2006.01)
    *H01L 41/18*     (2006.01)
    *H03H 9/02*     (2006.01)

(52) U.S. Cl.
    CPC .......... *H03H 3/08* (2013.01); *H03H 9/02559* (2013.01); *H03H 9/25* (2013.01)

(56) References Cited

OTHER PUBLICATIONS

Bartasyte, A., "Reduction of Temperature Coefficient of Frequency in LiTaO3 Single Crystals for Surface Acoustic Wave Applications", IEEE, 2012.

\* cited by examiner

METHOD OF MANUFACTURING AN OXIDE SINGLE CRYSTAL SUBSTRATE FOR A SURFACE ACOUSTIC WAVE DEVICE

TECHNICAL FIELD

The present invention relates to a method of manufacturing an oxide single crystal substrate used for a surface acoustic wave device.

BACKGROUND ART

Recent communication systems such as mobile phones need to support various communication standards and furthermore even with the same communication standard the frequency band differs depending on the country and region, so that the respective standards consist of a plurality of frequency bands. In such a communication system, among others a SAW (Surface Acoustic Wave) device, in which interdigital electrodes for exciting a surface acoustic wave are formed on a piezoelectric substrate in order to adjust and select a frequency, is in use.

For this surface acoustic wave device, a piezoelectric material such as lithium tantalate ($LiTaO_3$; LT) and lithium niobate ($LiNbO_3$; LN) is used to make the base substrate, because piezoelectric materials meet the requirements of small size, small insertion loss, and ability to stop passage of unnecessary waves. In particular, communication standards of cellular phones of the third generation and beyond often have a narrow differential in frequency band between transmission and reception, and a wide bandwidth, but on the other hand, the piezoelectric substrate material used conventionally for surface acoustic wave devices changes its characteristics depending on the temperature, so that the frequency selection range may be shifted, resulting in problems in the functions of the filter and duplexer. Therefore, a material for a surface acoustic wave device having small tendency to undergo fluctuation in characteristics with respect to temperature change and having a wide band is on demand.

Regarding the material for the surface acoustic wave device, for example, IP Document 1 teaches that a stoichiometric composition LT composed of copper used as an electrode material and mainly obtained by a gas phase method is preferable because the breakdown mode which is destroyed at the moment when high power is input to the IDT electrode is difficult to occur. IP Document 2 has a detailed description on the stoichiometry composition LT obtained by the gas phase method; and IP Document 3 describes a method of forming a waveguide for annealing a waveguide formed in a ferroelectric crystal of lithium tantalate or lithium niobate; and IP Document 4 describes a piezoelectric substrate for a surface acoustic wave device obtained by subjecting a lithium tantalate or lithium niobate single crystal substrate to Li diffusion treatment. IP Document 5 and Non-IP Document 1 also report that when LT in which the LT composition is uniformly transformed to Li-rich in the thickness direction by the gas phase equilibrium method is used to make the surface acoustic wave element, its frequency temperature characteristic is improved, which is preferable.

However, the inventors of the present invention have examined the methods described in these publications, and as a result, it has been found that these methods do not necessarily provide favorable results. In particular, according to the method described in IP Document 5, since the wafer is processed over a long period of time of 60 hours at a high temperature of about 1300° C. in the vapor phase, the manufacturing temperature has to be high, the consequent warpage of the wafer is large, and cracks occur at high rate, whereby the productivity becomes poor, and there is also a problem that the product becomes too expensive as a material for a surface acoustic wave device. Moreover, the degrees of variation in characteristics become large on account of the facts that the vapor pressure of $Li_2O$ is low and the modification degree of the sample to be modified varies depending on the distance from the Li source, and hence a considerable improvement is required for industrialization, and this problem has not been solved yet.

PRIOR ART DOCUMENTS

Non-IP Publications

Bartasyte, A. et. al, "Reduction of temperature coefficient of frequency in $LiTaO_3$ single crystals for surface acoustic wave applications" Applications of Ferroelectrics held jointly with 2012 European Conference on the Applications of Polar Dielectrics and 2012 International Symp Piezoresponse Force Microscopy and Nanoscale Phenomena in Polar Materials (ISAF/ECAPD/PFM), 2012 Intl Symp, 2012, Page(s): 1-3

IP Publications

IP Publication 1: Japanese Patent Application Publication No. 2011-135245
IP Publication 2: U.S. Pat. No. 6,652,644 (B1)
IP Publication 3: Japanese Patent Application Publication No. 2003-207671
IP Publication 4: Japanese Patent Application Publication No. 2013-66032
IP Publication 5: WO2013/135886(A1)

SUMMARY OF THE INVENTION

Problems to be Solved by Invention

As a result of extensive studies to solve the above problems, the present inventors have come to contrive a method for manufacturing an oxide single crystal substrate which includes steps of slicing an oxide single crystal ingot which has a substantially congruent composition and has been subjected to a single polarization treatment, burying the slice in a powder mainly consisting of $Li_3TaO_4$, $Li_3NbO_4$ or the like, and heating it in a gas phase treatment for modifying them such that the resulting profile shows higher Li concentration in areas closer to the surface of the slice and lower Li concentration in areas closer to the middle of the slice. However, it was also found that although the oxide single crystal substrate manufactured in this way has good frequency temperature behavior and undergoes scarce cracks or warpage, variations occur in the acoustic velocity of the SAW in the substrate surfaces. Such variations in characteristics within the substrate surface cause variations in the characteristics of the surface acoustic wave device fabricated using this substrate, so it is desirable that such variations be as small as possible.

Accordingly, an object of the present invention is to provide a method of manufacturing an oxide single crystal substrate with less variations in characteristics in the substrate surface.

Means for Solving the Problem

As a result of extensive studies to achieve the above object, the present inventors have found that it is possible to suppress the variation in acoustic velocity of the SAW in the substrate surface if the following procedure is conducted: make a slurry by dispersing a powder containing a lithium compound in a medium, and, while keeping this slurry in contact with the surface of the oxide single crystal substrate, heat the substrate whereby Li is diffused into the substrate from the surface thereof and causes modification to the substrate, and hence they possessed this invention.

In other words, the manufacturing method of the present invention comprises dispersing a powder containing an Li compound in a medium to form a slurry, and heating the oxide single crystal substrate with the slurry in contact with the surface thereof, so as to cause the Li to diffuse into the substrate from its surface to thereby effect a modification (reforming) of the substrate.

Further, in the manufacturing method of the present invention it is characteristic that a powder containing a Li compound is dispersed in a medium to form a slurry, the slurry is brought into contact with the surface of the oxide single crystal substrate, and the substrate together with the slurry is buried in a powder containing Li compound, to which heat is applied to effect diffusion of the Li inside the substrate from the surface thereof so as to obtain a thus modified oxide single crystal substrate.

Furthermore, in the manufacturing method of the present invention, it is also characteristic in that a powder containing a Li compound is dispersed in a medium to form a slurry, the slurry is brought into contact with the surface of an oxide single crystal substrate cut out from an oxide single crystal ingot consisting of a roughly congruent composition to which single polarization processing has been applied, and the substrate together with the slurry is buried in a powder containing a Li compound, to which heat is applied to effect diffusion of the Li inside the substrate from the surface thereof so as to obtain a modified oxide single crystal substrate which has a profile showing higher Li concentration in areas closer to the surface of the substrate and lower Li concentration in areas closer to the middle of the substrate.

The average particle size (diameter) of the powder containing the Li compound used in the manufacturing method of the present invention is preferably 0.001 through 50 µm.

Effects of the Invention

According to the present invention, it is possible to manufacture an oxide single crystal substrate which has small warpage, scarce cracks and scratches, good frequency temperature characteristics, and undergoes less variations in characteristics in the substrate surface.

EMBODIMENTS FOR CARRYING OUT THE INVENTION

Figure 1:
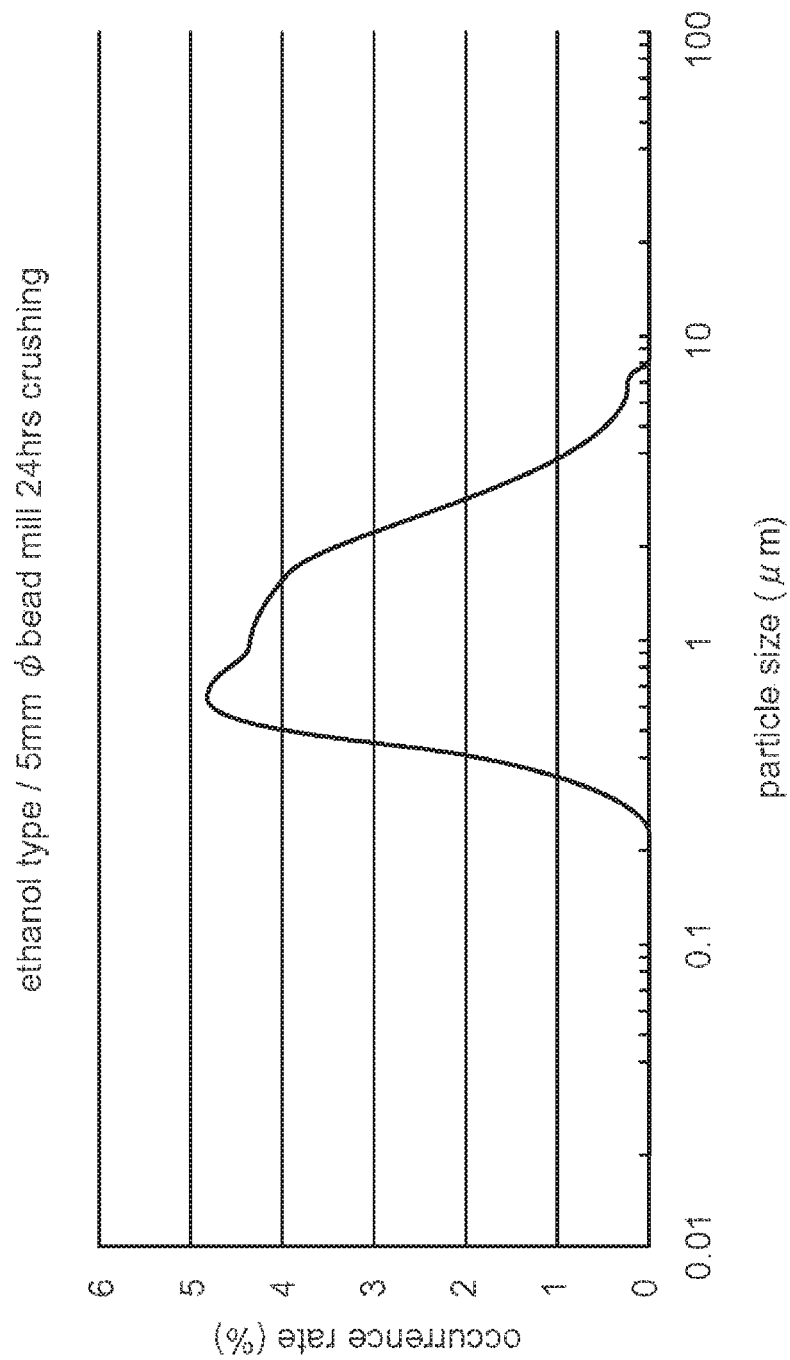
FIG. 1 shows a particle size distribution of a slurry of a 5 mm φ bead mill/ethanol dispersion medium.

Hereinafter, embodiments of the present invention will be described in detail, but the present invention is not limited to these embodiments.

The present invention is characteristic in that a slurry is prepared by dispersing a powder containing a Li compound in a medium, and, while keeping this slurry in contact with the surface of a piezoelectric oxide single crystal substrate, heat is applied to the substrate whereby Li is diffused into the substrate from the surface thereof and causes modification to the substrate. As a material of the piezoelectric oxide single crystal substrate manufactured according to the present invention, a lithium compound such as lithium tantalate, lithium niobate, lithium tetraborate and the like can be adopted.

In the present invention, the choice of the Li compound to be contained in the powder is not particularly limited, but it is preferably a compound containing the same element as the oxide single crystal substrate material to be subjected to the modification treatment step. For example, when the material of the oxide single crystal substrate is $LiTaO_3$, it is preferable to use $Li_3TaO_4$ as the main component of the powder material, and in the case of $LiNbO_3$, it is preferable to use $Li_2NbO_4$ as the main component of the powder material. Furthermore, although the powder may be composed of a single compound, it may be a mixture of a plurality of compounds.

The slurry in the present invention means a dispersion medium in which a powder containing a Li compound is suspended as a dispersoid. The dispersion medium is not particularly limited, and water or an organic solvent may be used.

The average particle size of the powder containing the Li compound to be dispersed in the medium is preferably from 0.001 through 50 µm, more preferably from 0.01 through 10 µm. When the average particle size of the powder is made smaller, its contact with the substrate can be made more uniform, whereby it is thought it becomes possible to attain a more uniform modifying treatment. This is also considered to be the case when the modifying treatment is carried out with only the powder without using the slurry; however, if the average particle size of such powder is in the order of µm or lower, the packing density in air would become over low. On the other hand, when particles are dispersed in a liquid to form a slurry, repulsive force can be exerted between particles even if the particle size is in the order of nm (nanometers) to µm, so that it is possible to secure a substantially high packing density.

Therefore, if the modifying treatment is performed using such a slurry, it is considered that a more uniform oxide single crystal substrate can be obtained. In addition, when the powder containing the Li compound is a mixture of a plurality of compounds, then there is also an advantage if the mixture is dispersed in the medium to produce a slurry, for the mixture can be easily homogenized thereby.

Here, the "average particle size" in the present invention means the average particle size obtained by measuring the particle size distribution by the laser diffraction/scattering method and then obtaining the average size (volume average size) by weighting the measured result with the volume of each particle of respective particle size.

The slurry of the present invention may contain additives, etc. in addition to the powder which is the dispersoid and the dispersion medium such as water and organic solvent, and in particular, a dispersant is preferably to be contained. There are no restrictions on the types of additives and dispersants to be added, and they may be selected depending on the requirements.

In the present invention, it is possible that a slurry is brought into contact with the surface of an oxide single crystal substrate, which is then buried in a powder containing a Li compound, to which a heat is applied whereby Li is caused to diffuse into the substrate from the surface thereof so as to effect a modification of the substrate. By virtue of this method, the Li diffusion process can be completed in a shorter length of time, so that the adverse effects on the substrate induced by the heat application can be minimized.

Further, in the present invention, it is preferable to carry out the modification treatment such that the Li concentration is higher in areas closer to the surface of the substrate and the Li concentration is lower in areas closer to the middle of the substrate. By virtue of this, an oxide single crystal substrate having small warpage, few cracks and scratches, and excellent frequency temperature characteristics can be obtained.

The vapor phase Li diffusion treatment of the present invention is a technique in which lithium is put in a defective portion in the crystal structure so as to approximate the stoichiometric ratio of tantalum to lithium towards 1:1; and since the diffusion of lithium progresses more rapidly when this vapor phase treatment is conducted in an oxygen-free atmosphere, such as nitrogen atmosphere, an inert gas atmosphere and vacuum, than in an oxygen-containing atmosphere, it preferable to conduct the treatment in an oxygen-free atmosphere, whereby the treatment time is shortened and thus the warpage of the substrate is reduced.

The reason for this is not known clearly, but it is thought that when the reaction atmosphere is set to, for example, a nitrogen atmosphere, an oxygen defective site in addition to the Li defective site is generated in the crystal structure, whereby the diffusion of Li would proceed making use of this oxygen defective site. It is also assumed that, besides conventionally filling in the Li defective site, Li works some sort of interaction with the oxygen defective site with a possible result of a creation of some new crystal structure not found in the past.

Now, the conditions for vapor phase Li diffusion treatment of the present invention are not particularly limited, but it is preferable to perform it at 850° C. through 1000° C., for about 10 to 50 hours. If the heating temperature is too high, warpage of the substrate becomes large and productivity is consequently lowered. In addition, if the treatment time is too short, the SAW response characteristic is deteriorated, and on the other hand, if the treatment time is too long, the warpage again becomes large and the productivity goes down.

Furthermore, in the vapor phase treatment step of the present invention, it is preferable to perform the modifying by Li diffusion through the range of about 10 µm to 50 µm in depth in the thickness direction from the surface. This is because if the depth of modification is less than 10 µm, the SAW response characteristic is lowered, and if the modification depth is more than 50 µm, the treatment temperature required becomes higher and the treatment time longer, whereby problems of warping and cracking are strengthened.

In the gas phase treatment step of the present invention, it is preferable to cause the modification such that at least a part of the modified area has a pseudo stoichiometry composition. In particular, it is more preferable to modify the composition of the surface of the substrate to become a pseudo stoichiometry composition.

Now in the present invention, the "pseudo stoichiometry composition" differs depending on the material, but in the case of a lithium tantalate single crystal substrate, for example, it means a composition in which Li/(Li+Ta) is 0.490 to 0.510, and in the case of a lithium niobate single crystal substrate, it means a composition in which Li/(Li+Nb) is 0.490 to 0.510. For other materials, one can similarly define "pseudo stoichiometry composition" based on technical common knowledge.

As a method of evaluating the composition of a piezoelectric oxide single crystal substrate, a known method such as Curie temperature measurement may be used, but it is also possible to evaluate a local composition without destroying the material by using Raman spectroscopy.

For lithium tantalate single crystals and lithium niobate single crystals, it is known that a roughly linear relationship can be obtained between the half width of the Raman shift peak and the Li concentration, i.e., Li/(Li+Ta). [Ref. 2012 IEEE International Ultrasonics Symposium Proceedings, Page(s): 1252-1255, Applied Physics A 56, 311-315 (1993)] Therefore, by using a formula representing such a relationship, it is possible to evaluate the composition at an arbitrary position of the oxide single crystal substrate.

A formula representing a relationship between the half-value width of the Raman shift peak and the Li concentration is obtained by measuring the Raman half-value width for some samples having a known composition and different Li concentrations. As long as the conditions of Raman measurement are the same, it will do to use a formula already disclosed in literature, etc. For example, for lithium tantalate single crystal, the following formula (1) may be used [refer to: 2012 IEEE International Ultrasonics Symposium Proceedings, Page(s): 1252-1255], and for lithium niobate single crystal, the following formulae (2) and (3) may be used [refer to: Applied Physics A 56, 311-315 (1993)].

$$Li/(Li+Ta)=(53.15-0.5FWHM1)/100 \quad (1)$$

$$Li/(Li+Nb)=(53.03-0.4739FWHM2)/100 \quad (2)$$

$$Li/(Li+Nb)=(53.29-0.1837FWHM3)/100 \quad (3)$$

In the above formulae, FWHM1 is the half-value width of the Raman shift peak around 600 cm$^{-1}$, FWHM2 is the half-value width of the Raman shift peak around 153 cm$^{-1}$, and FWHM3 is the half-value width of the Raman shift peak around 876 cm$^{-1}$. For details of measurement conditions, refer to the respective documents.

Further, the thickness of the substrate of the present invention is preferably from 200 µm to 400 µm inclusive. The reason for this is that if the thickness of the substrate is too thick, the processing temperature must be set higher and the processing time must also be prolonged, so that it becomes difficult to obtain a substrate which has only insubstantial warpage and has scarce cracks or scratches.

EXAMPLES

Hereinafter, the present invention will be described in detail with reference to examples.

Example 1

In Example 1, first, a singly polarized 4-inch diameter lithium tantalate single crystal ingot having a roughly congruent composition and having a Li:Ta ratio of 48.5:51.5 was sliced to obtain a number of 300-µm-thick 38.5° rotation Y-cut lithium tantalate substrates. Thereafter, in view of a protocol, the surface roughness of each sliced wafer was adjusted to 0.15 µm in Ra value by a lapping procedure, and the finished thickness was set to 250 µm. After one side surface was finished into a quasi-mirror surface having an Ra value of 0.01 µm by planar polishing, a slurry obtained by dispersing a powder containing $Li_3TaO_4$ as a main component in ethanol was put to coat the surface of the lithium tantalate single crystal substrate.

The slurry used in this example was prepared by mixing powders of $Li_2CO_3$ and $Ta_2O_5$ at a molar ratio of 7:3, calcining the mixture at 1300° C. for 12 hours, dispersing the calcined mixture in ethanol and pulverizing the mixture on a pot mill turn table using beads of 5 mm$\phi$ for 24 hours. In this slurry, the mixing ratio of the ethanol and the said calcined mixture, namely, the mixture of the powders of $Li_2CO_3$ and $Ta_2O_5$ mixed at a molar ratio of 7:3 and calcined at 1300° C. for 12 hours was 52:48 by weight.

The particle size distribution and the zeta potential of the pulverized slurry were measured, and as a result, a particle size distribution as shown in FIG. 1 was obtained. The average particle diameter of this slurry was 0.37 µm and the maximum particle diameter thereof was 50 µm. Also, since the zeta potential was −59 mV, it can be seen from this result of the zeta potential that the dispersibility of this slurry was good.

Next, the lithium tantalate single crystal substrate coated with the slurry was placed in a small container; the small container was then set in an electric furnace, and the interior of the electric furnace was changed to an $N_2$ atmosphere and was heated at 950° C. for 60 hours to thereby cause Li to diffuse from the surface of the sliced wafer toward the middle thereof, whereby the approximate congruent composition was changed to a pseudo stoichiometry composition.

Thereafter, the sliced substrate subjected to this treatment was further subjected to an annealing treatment at 800° C., which is higher than its Curie temperature, for 12 hours under the atmosphere; then the temperature of the sliced substrate was lowered and in particular when the temperature was between 770° C. and 500° C. an electric field of 4000 V/m was applied in approximately +Z axis direction; next, a treatment to lower the temperature to the room temperature was conducted. After such treatment, the unpolished side face was subjected to a sand blasting as the finishing treatment whereby its Ra value became about 0.15 µm, and the quasi-mirror side face was subjected to a polishing treatment of 3 µm grade; thereupon a lithium tantalate single crystal substrates were obtained.

Figure 2:
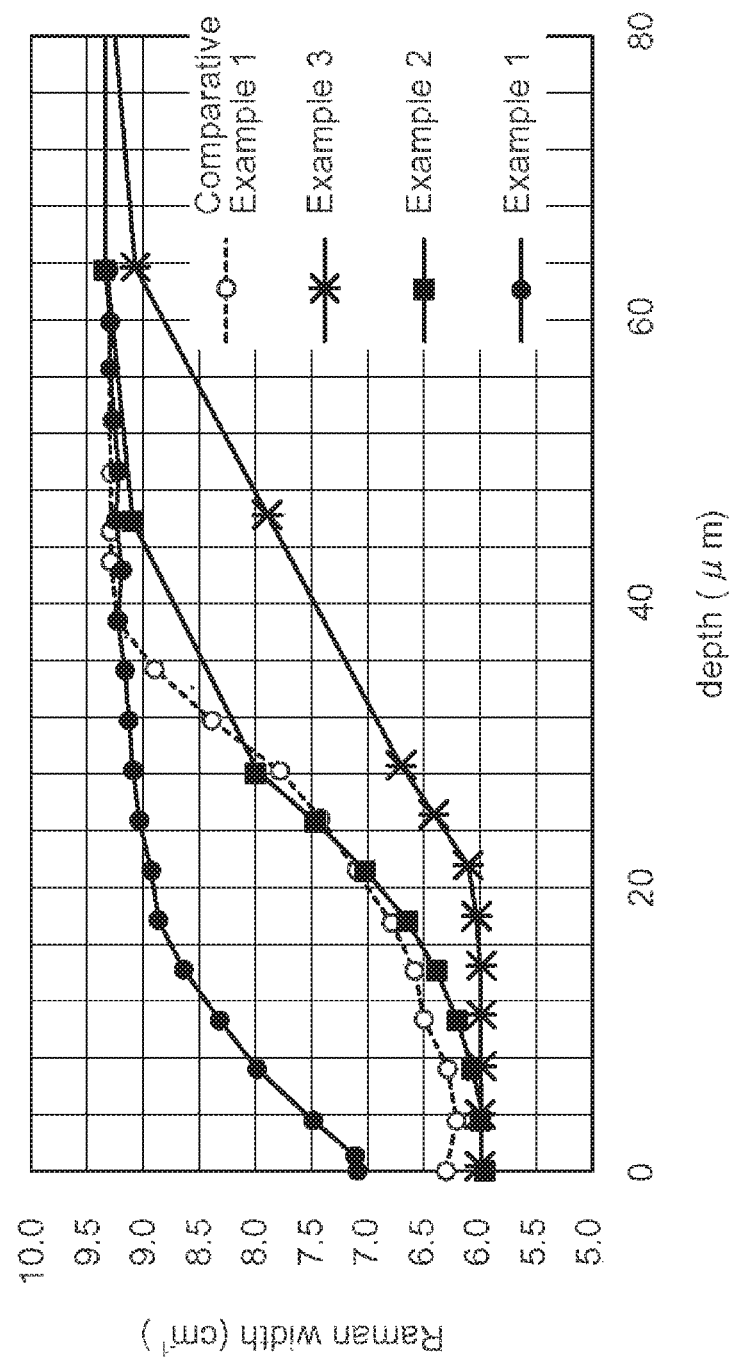
FIG. 2 shows Raman profiles of Example 1, Example 2, Example 3 and Comparative Example, respectively.

With respect of one of these lithium tantalate single crystal substrates, which had been singly polarized by means of the heat treatment, a laser Raman spectrometer (LabRam HR series manufactured by HORIBA Scientific Inc., Ar ion laser, spot size 1 µm, room temperature) was used to measure the half-value width of the Raman shift peak around 600 $cm^{-1}$, which is an indicator of the Li diffusion amount, through a depth-wise distance from the surface at an arbitrarily chosen site which was 1 cm or more away from the outer circumference of the circular substrate; and as the result a Raman profile as shown in FIG. 2 was obtained.

According to the result of this Raman profile in FIG. 2, the value of the Raman half-value width of the substrate of Example 1 changed as the measuring point went deeper from about 1 µm to about 30 µm in the depth direction of the substrate as measured from its surface; namely, the closer the measuring point was to the surface of the substrate, the smaller was the Raman half-value width value, and the closer the measuring point was to the middle of the substrate, the greater was the Raman half-value width value; wherefore it was confirmed from the result of the Raman profile that in the range where the depth was between about 1 µm and about 30 µm in the substrate, the Li concentration was higher in areas closer to the surface of the substrate and the Li concentration was lower in areas closer to the middle of the substrate.

Since the Raman half-width at the substrate surface was about 7.1 $cm^{-1}$, the composition of the substrate surface is assumed roughly to be such that Li/(Li+Ta)=0.496 in accordance with the following formula (1), and consequently the surface area was found to be of a pseudo stoichiometry composition.

$$Li/(Li+Ta)=(53.15-0.5FWHM1)/100 \qquad (1)$$

Next, a small piece was cut out from the Li-diffused 4-inch 38.5° rotation Y cut lithium tantalate single crystal substrate obtained in Example 1, and, in a Piezo d33/d15 meter (model ZJ-3BN) manufactured by The Institute of Acoustics of the Chinese Academy of Sciences, the small piece was given a vertical vibration in the thickness direction to the principal face and also to the back face respectively to observe the voltage waveform thereby induced, and a waveform was observed which indicated a presence of piezoelectric response; hence it was confirmed that the lithium tantalate single crystal substrate of Example 1 has piezoelectricity, and thus can be used as a surface acoustic wave device.

Next, a 38.5° Y-cut lithium tantalate single crystal substrate of Example 1 which had been subjected to the Li diffusion treatment was exposed to a sputtering treatment to receive on its surface an Al film having a thickness of 0.2 µm, and a resist material was applied to the thus treated substrate; then, an electrode pattern of a one-port SAW resonator was exposed and developed in a stepper, and an electrode was formed by means of RIE. One wavelength of the patterned SAW resonator was set to be 2.40 µm.

The SAW waveform characteristic of this one-port SAW resonator was explored by means of an RF prober, and the results shown in Table 1 were obtained. Table 1 shows the values of resonance frequency (fr), anti-resonance frequency (fa), electromechanical coupling coefficient k2 and mean sound velocity obtained from the SAW waveform.

The electromechanical coupling coefficient K2 was calculated based on the following equation, and the average sound velocity was calculated from the product of the wavelength 2.4 µm by the average value (unit: m/s) of the resonance frequency and the anti-resonance frequency, and the results are as shown in Table 1.

Equation to obtain K2:

$$K2=(\pi fr/2fa)/\tan(\pi fr/2fa)$$

where fr is resonance frequency and fa is anti-resonance frequency.

With respect to the substrate of Example 1, the average of the sound velocity values of SAW taken at five different points, namely at ±20 mm and ±40 mm away from the center point in the direction of the crystal X axis as well as the center point, was calculated by means of the RF prober of SAW resonator in the similar manner as described immediately above; then, the difference between the maximum value and the minimum value of the average sound velocity values of the five points was calculated, and the dispersion in the average sound velocity of the SAW (sound velocity distribution) was evaluated based on this value, and the value was 0.5 m/s.

Example 2

In Example 2, as in Example 1, 300-µm-thick 38.5° rotation Y-cut lithium tantalate substrates having a roughly congruent composition were used; lapping and planar polishing were carried out upon each substrate in the same manner as in Example 1, and each substrate was subjected to a Li diffusion treatment, an annealing treatment and a finishing touch by polishing, all under the similar conditions as in Example 1, and thus a plurality of lithium tantalate single crystal substrates for surface acoustic wave elements were obtained.

In this Example 2, however, the Li diffusion treatment consisted of coating the surface of the lithium tantalate single crystal substrate with a slurry obtained by dispersing in ethanol a powder consisting of $Li_3TaO_4$ as a main component, and then burying the substrate in a powder mainly composed of $Li_3TaO_4$, followed by application of a heat treatment to this.

Thus, the slurry used was the same as that used in Example 1, and the powder used for burying the substrate was a powder containing $Li_3TaO_4$ as a main component; in particular, this powder was made by mixing powders of $Li_2CO_3$ and $Ta_2O_5$ at a molar ratio of 7:3 and then firing the mixture at 1300° C. for 12 hours. When 0.1 g of this powder was dispersed in ethanol and its particle size distribution was measured (by Microtrac MT 3300 II, manufactured by Nikkiso Co., Ltd.), the obtained average particle size was 78 μm, the maximum particle size being 262 μm.

Next, this lithium tantalate single crystal substrates were buried in the afore-described powder and heat-treated to produce single polarized substrates similar to those of Example 1, and one piece of them was subjected to a laser Raman spectrometer (LabRam HR series manufactured by HORIBA Scientific Inc., Ar ion laser, spot size 1 m, room temperature) to measure the half-value width of the Raman shift peak around 600 $cm^{-1}$, which is an indicator of the Li diffusion amount, through a depth-wise distance from the surface at an arbitrarily chosen site which was 1 cm or more away from the outer circumference of the circular substrate; and as the result a Raman profile as shown in FIG. 2 was obtained.

According to the result of the Raman profile in FIG. 2, it was confirmed that the value of the Raman half-value width of the substrate of Example 2 changed, as the measuring point went deeper from about 13 μm to about 40 μm in the depth direction of the substrate, in a manner such that the closer the measuring point was toward the surface of the substrate, the smaller was the Raman half-value width value, and that the closer the measuring point was to the middle of the substrate, the greater was the Raman half-value width value.

Since the Raman half-width at the substrate surface was about 6.0 $cm^{-1}$, the composition of the substrate surface is assumed roughly to be such that Li/(Li+Ta)=0.515 in accordance with the formula (1), and consequently the surface area was found to be of a pseudo stoichiometry composition.

Next, a 38.5° Y-cut lithium tantalate single crystal substrate which had been subjected to the Li diffusion treatment of Example 2 was exposed to a sputtering treatment to receive on its surface an Al film having a thickness of 0.2 μm, and a resist material was applied to the thus treated substrate; then, an electrode pattern of a one-port SAW resonator was exposed and developed in a stepper, and an electrode was formed by means of RIE. One wavelength of the patterned SAW resonator was set to be 2.40 μm.

Figure 3:
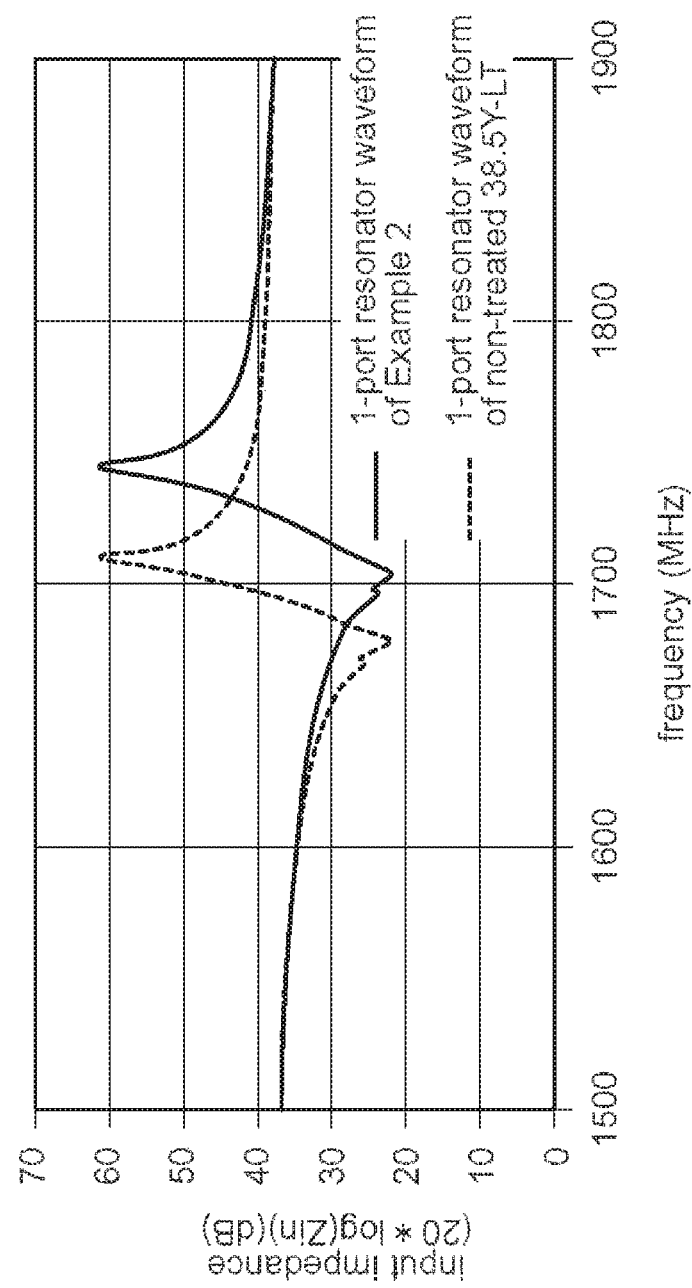
FIG. 3 shows waveforms of one-port SAW resonators of Example 2 and Example 3, respectively.
Figure 4:
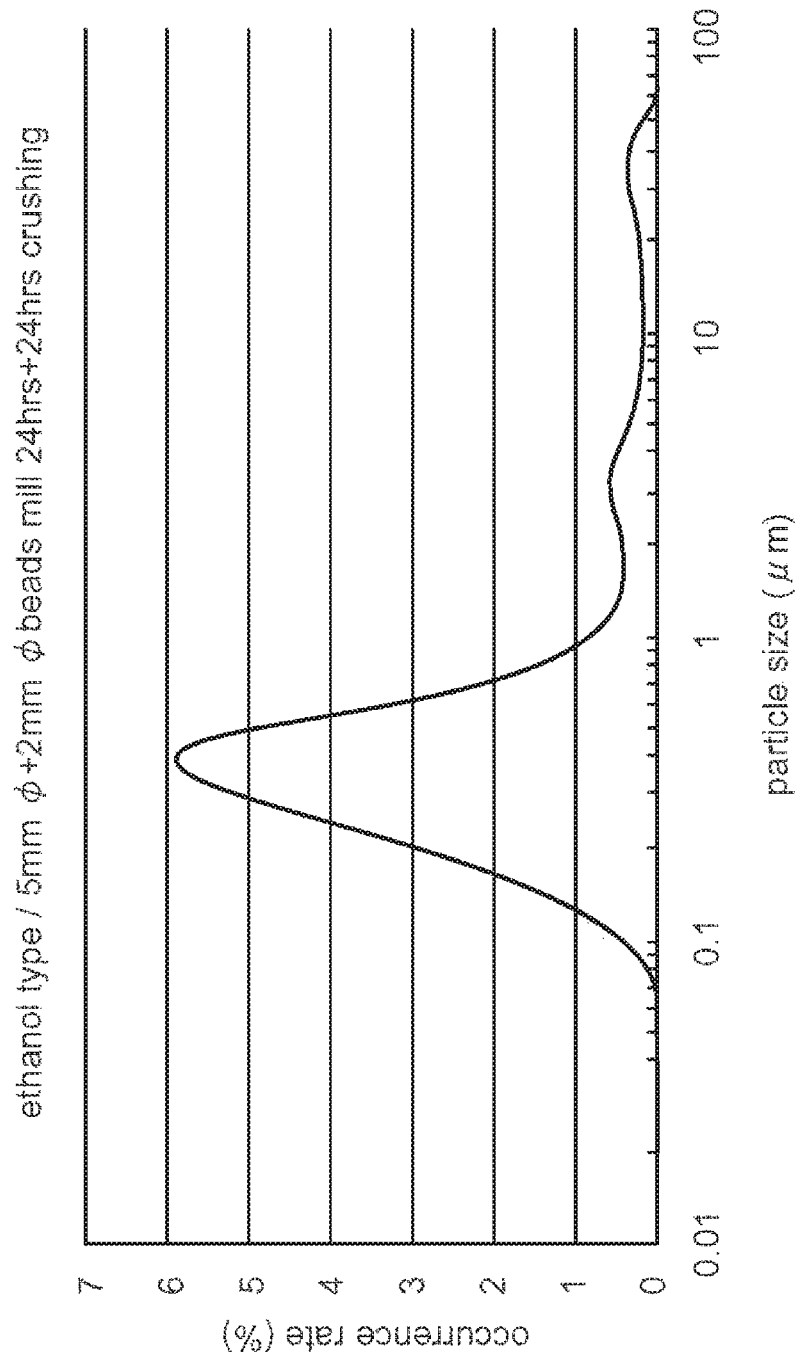
FIG. 4 shows the particle size distribution of a slurry of 5 mmφ+2 mmφ bead mill/ethanol dispersion medium.

Then, the SAW waveform characteristic of this one-port SAW resonator was explored by means of an RF prober, and the results shown in FIG. 3 were obtained. The values of resonance frequency (fr), anti-resonance frequency (fa), electromechanical coupling coefficient k2 and mean sound velocity obtained from the SAW waveform shown in FIG. 3 are entered in Table 1. It is noted that the values of electromechanical coupling coefficient k2 and mean sound velocity were calculated in the same method as in Example 1.

With respect to the substrate of Example 2 also, as was done in Example 1, the average of the sound velocity values of SAW taken at five different points, which were at ±20 mm and ±40 mm away from the center in the direction of the crystal X axis as well as at the center, was calculated; then, the dispersion in its average sound velocity of the SAW (sound velocity distribution) was evaluated based on this value, and the result was 0.3 m/s.

Example 3

In Example 3, as in Example 2, 300-μm-thick 38.5° rotation Y-cut lithium tantalate substrates having a roughly congruent composition were used; lapping and planar polishing were carried out upon each substrate in the same manner as in Example 2, and each substrate was subjected to a Li diffusion treatment, an annealing treatment and a finishing touch by polishing, all under the similar conditions as in Example 2, and thus a plurality of lithium tantalate single crystal substrates for surface acoustic wave elements were obtained.

The slurry used in Example 3 was the slurry used in Example 2 except that it was further pulverized for another 24 hours on a pot mill turntable using beads of 2 mmφ. Then, the particle size distribution of the slurry was measured, and the average particle size was 1.0 μm and the maximum particle size was 7.0 μm.

Next, with respect of one of the substrates thus obtained, a measurement was conducted on it to obtain the half-value width of the Raman shift peak around 600 $cm^{-1}$, which is an indicator of the Li diffusion amount, through a depth-wise distance from the surface of the substrate and as the result a Raman profile as shown in FIG. 2 was obtained. According to this resulting Raman profile, the value of the Raman half-value width at the substrate surface was about 6.0 $cm^{-1}$, wherefore, by using the previously mentioned Equation (1), the composition of the substrate at its surface was Li/(Li+Ta)=0.515, and thus it was found that a pseudo stoichiometric composition had occurred there.

Also it was confirmed that in the depth range between 20 μm and about 60 μm from the substrate surface, the Raman profile was such that the closer the measuring point was toward the substrate surface the smaller was the Raman half-value width value, and the closer the measuring point was toward the middle of the substrate the greater was the Raman half-value width value.

From the above results, this substrate of Example 3 was found to have a pseudo-stoichiometric composition in the range from its surface to the depth of about 20 μm, and also found to have a Li concentration profile such that the closer the measuring point is to the substrate surface, the higher is the Li density and that the closer the measuring point is to the middle of the substrate, the lower is the Li density.

Next, the 38.5° Y-cut lithium tantalate single crystal substrate of Example 3 which had been subjected to the Li diffusion treatment was also exposed to the sputtering treatment and the resist application treatment as in Example 2; then, an electrode was formed of it.

With respect to this one-port SAW resonator, its SAW waveform characteristic was examined by an RF prober, and the same result as in the case of Example 2 shown in FIG. 3 was obtained. The resonance frequency (fr), anti-resonance frequency (fa), electromechanical coupling coefficient k2 and average sound velocity obtained from the SAW waveform of FIG. 3 are shown in Table 1. The electromechanical coupling coefficient k2 and the average sound velocity value were calculated by the same method as in Example 1.

Also with respect to the substrate of Example 3, in the same method as in Example 1, the average sound velocity of SAW was calculated from the measurements at 5 points, namely at ±20 mm and ±40 mm away from the center of the substrate in the crystal X-axis direction as well as the center, and the dispersion in the average sound velocity (sound velocity distribution) was determined, and the value was 0.1 m/s.

Comparative Example

In this comparative example, as in Example 2, using 300-μm-thick 38.5° rotation Y-cut lithium tantalate substrates having a roughly congruent composition, the lapping and planar polishing were carried out in the same manner as in Example 2, and then Li diffusion treatment, annealing treatment and finish polishing treatment under the same conditions as in Example 2 were carried out upon them to obtain a plurality of lithium tantalate single crystal substrates for surface acoustic wave devices.

In the Li diffusion treatment process of this comparative example, the surface of the lithium tantalate single crystal substrate was not dabbed with the slurry but was buried as it was in a powder mainly composed of $Li_3TaO_4$ and was subjected to the heat treatment. The same powder as used in Example 2 was used for the burying.

For one of the substrates thus obtained, the half-value width of the Raman shift peak in the vicinity of 600 cm$^{-1}$, which is an index of the amount of Li diffusion, was measured from the surface of this substrate in the depth direction, and the Raman profile thus obtained was as shown in FIG. 2. According to the result of this Raman profile, it was confirmed that, in the range between the surface and the depth of about 40 μm, the value of the Raman half-value width decreases as the measurement approaches the substrate surface, and the value of the Raman half-value width increases as it approaches the middle of the substrate.

From the above results, it was confirmed that the substrate of Comparative Example shows a concentration profile in which, in the range between the substrate surface and the depth of about 40 μm, the Li concentration increases as the measurement approaches substrate surface, and the Li concentration decreases as the measurement approaches the middle of the substrate.

Next, the 38.5° Y-cut lithium tantalate single crystal substrate of Comparative Example, already subjected to the Li diffusion treatment, was subjected to a sputtering treatment and a resist application treatment in the same manner as in Example 2, and then an electrode was formed of it.

With respect to this one-port SAW resonator, its SAW waveform characteristic was examined by an RF prober, and the same result as in Example 2 shown in FIG. 3 was obtained. The resonance frequency (fr), the anti-resonance frequency (fa), the electromechanical coupling coefficient k2 and the average sound velocity obtained from the SAW waveform of FIG. 3 are shown in Table 1. The electromechanical coupling coefficient k2 and the average sound velocity value were calculated in the same manner as in Example 2.

Also with respect to the substrate of Comparative Example, the average sound velocity of the SAW taken over five points of ±20 mm and ±40 mm away from the center in the crystal X-axis direction and the center of the substrate was calculated by the same method as in Example 2, and the dispersion in the average sound velocity (sound velocity distribution) was determined, and the value was 0.8 m/s.

The evaluation results of Examples 1 through 3 and Comparative Example are summarized as shown in the following Table 1.

TABLE 1

| | resonance frequency (MHz) | anti-resonance frequency (MHz) | $K^2$ (%) | average sound velocity (m/s) | sound velocity distribution (m/s) |
|---|---|---|---|---|---|
| Example 1 | 1695.0 | 1732.0 | 5.2 | 4112.4 | 0.5 |
| Example 2 | 1704.1 | 1744.4 | 5.6 | 4138.1 | 0.3 |
| Example 3 | 1704.1 | 1744.4 | 5.6 | 4138.1 | 0.1 |
| Comparative Example | 1704.1 | 1744.4 | 5.6 | 4138.1 | 0.8 |
| non-treated 38.5° $Y_{cut}$-LT | 1681.3 | 1711.9 | 4.3 | 4071.8 | 0.1 |

According to the results of Table 1, as is clear from the results of Examples 1 to 3, if the slurry is used in the Li diffusion treatment step, and preferably if the oxide single crystal substrate is buried in the powder containing a Li compound and heated, the sound velocity distribution can be restricted to 0.5 m/s or less, so that it is possible to obtain an effect that the resulting oxide single crystal substrate has less dissipation in characteristics within the substrate surface.

The invention claimed is:

1. A method of manufacturing a piezoelectric oxide single crystal substrate product for a surface acoustic wave device, comprising steps of:
preparing a slurry by dispersing a first powder containing a Li compound in a medium, the first powder having an average particle size of 0.001 through 50 μm;
applying said slurry to a surface of a piezoelectric oxide single crystal substrate made of a lithium compound cut from a piezoelectric oxide single crystal ingot having a roughly congruent composition which has been subjected to single polarization treatment;
burying said substrate with said slurry in a second powder containing said Li compound, the second powder having an average particle size of 0.001 through 50 μm; and
heating said substrate buried in said second powder in a temperature range from 850° C. through 1000° C. in an oxygen-free atmosphere selected from a nitrogen atmosphere, an inert gas atmosphere and a vacuum, so as to diffuse Li into said substrate about 10 μm to 50 μm in depth in the thickness direction from the surface thereof so as to make a profile of Li concentration wherein the Li concentration is higher at the surface, and the Li concentration decreases inwardly,
wherein the piezoelectric oxide single crystal substrate product has a sound velocity distribution of 0.5 m/s or less,
wherein the Li compound comprises $Li_3TaO_4$.

2. The method according to claim 1, wherein the thickness of the substrate is from 200 μm to 400 μm.

3. A method of manufacturing a piezoelectric oxide single crystal substrate product for a surface acoustic wave device, comprising steps of:
preparing a slurry by dispersing a first powder containing a Li compound in a medium, the first powder having an average particle size of 0.001 through 50 μm;

applying said slurry to a surface of a piezoelectric oxide single crystal substrate made of a lithium compound cut from a piezoelectric oxide single crystal ingot having a roughly congruent composition which has been subjected to single polarization treatment;

burying said substrate with said slurry in a second powder containing said Li compound, the second powder having an average particle size of 0.001 through 50 µm; and heating said substrate buried in said second powder in a temperature range from 850° C. through 1000° C. in an oxygen-free atmosphere selected from a nitrogen atmosphere, an inert gas atmosphere and a vacuum, so as to diffuse Li into said substrate about 10 µm to 50 µm in depth in the thickness direction from the surface thereof so as to make a profile of Li concentration wherein the Li concentration is higher at the surface, and the Li concentration decreases inwardly, wherein the piezoelectric oxide single crystal substrate product has a sound velocity distribution of 0.5 m/s or less wherein the Li compound comprises $Li_3NbO_4$.

4. The method according to claim 3, wherein the thickness of the substrate is from 200 µm to 400 µm.

5. A method of manufacturing a piezoelectric oxide single crystal substrate product for a surface acoustic wave device, comprising steps of:

preparing a slurry by dispersing a first powder containing a Li compound in a medium, the first powder having an average particle size of 0.001 through 50 µm;

applying said slurry to a surface of a piezoelectric oxide single crystal substrate made of a lithium compound cut from a piezoelectric oxide single crystal ingot having a roughly congruent composition which has been subjected to single polarization treatment;

burying said substrate with said slurry in a second powder containing said Li compound, the second powder having an average particle size of 0.001 through 50 µm; and heating said substrate buried in said second powder in a temperature range from 850° C. through 1000° C. in an oxygen-free atmosphere selected from a nitrogen atmosphere, an inert gas atmosphere and a vacuum, so as to diffuse Li into said substrate about 10 µm to 50 µm in depth in the thickness direction from the surface thereof so as to make a profile of Li concentration wherein the Li concentration is higher at the surface, and the Li concentration decreases inwardly, wherein the piezoelectric oxide single crystal substrate product has a sound velocity distribution of 0.5 m/s or less, wherein the oxide single crystal substrate is made of $LiTaO_3$, and the first powder and the second powder comprise $Li_3TaO_4$.

6. The method according to claim 5, wherein the thickness of the substrate is from 200 µm to 400 µm.

7. A method of manufacturing a piezoelectric oxide single crystal substrate product for a surface acoustic wave device, comprising steps of:

preparing a slurry by dispersing a first powder containing a Li compound in a medium, the first powder having an average particle size of 0.001 through 50 µm;

applying said slurry to a surface of a piezoelectric oxide single crystal substrate made of a lithium compound cut from a piezoelectric oxide single crystal ingot having a roughly congruent composition which has been subjected to single polarization treatment;

burying said substrate with said slurry in a second powder containing said Li compound, the second powder having an average particle size of 0.001 through 50 µm; and heating said substrate buried in said second powder in a temperature range from 850° C. through 1000° C. in an oxygen-free atmosphere selected from a nitrogen atmosphere, an inert gas atmosphere and a vacuum, so as to diffuse Li into said substrate about 10 µm to 50 µm in depth in the thickness direction from the surface thereof so as to make a profile of Li concentration wherein the Li concentration is higher at the surface, and the Li concentration decreases inwardly, wherein the piezoelectric oxide single crystal substrate product has a sound velocity distribution of 0.5 m/s or less, wherein the oxide single crystal substrate is made of $LiNbO_3$, and the first powder and the second powder comprise $Li_3NbO_4$.

8. The method according to claim 7, wherein the thickness of the substrate is from 200 µm to 400 µm.

* * * * *